United States Patent
Jeon et al.

(10) Patent No.: US 9,065,075 B1
(45) Date of Patent: Jun. 23, 2015

(54) ORGANIC LIGHT EMITTING DISPLAY DEVICE AND FABRICATING METHOD THEREOF

(71) Applicant: SAMSUNG DISPLAY CO., LTD., Yongin, Gyeonggi-Do (KR)

(72) Inventors: Woosik Jeon, Hwaseong-si (KR); Seil Kim, Hwaseong-si (KR); Sung Soo Lee, Suwon-si (KR); Yonghan Lee, Seongnam-si (KR); Okkeun Song, Hwaseong-si (KR); Eunji Choi, Bucheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/303,562

(22) Filed: Jun. 12, 2014

(30) Foreign Application Priority Data

Dec. 16, 2013 (KR) .......................... 10-2013-0156528

(51) Int. Cl.
*H01L 51/56* (2006.01)
*H01L 51/52* (2006.01)

(52) U.S. Cl.
CPC ............ *H01L 51/5268* (2013.01); *H01L 51/56* (2013.01)

(58) Field of Classification Search
USPC ........................................................ 257/40
See application file for complete search history.

(56) References Cited

U.S. PATENT DOCUMENTS

| 7,919,773 B2 * | 4/2011 | Kawakami et al. ............. 257/40 |
| 2001/0033135 A1 | 10/2001 | Duggal et al. |
| 2005/0029538 A1 * | 2/2005 | Choi et al. ..................... 257/103 |
| 2005/0205863 A1 * | 9/2005 | Choi et al. ........................ 257/40 |
| 2010/0001262 A1 * | 1/2010 | Kim et al. ........................ 257/40 |
| 2010/0025669 A1 * | 2/2010 | Hwang et al. ................... 257/40 |

(Continued)

FOREIGN PATENT DOCUMENTS

| JP | 2004-349064 | 12/2004 |
| JP | 2005-72002 | 3/2005 |
| JP | 2007-294438 | 11/2007 |

(Continued)

OTHER PUBLICATIONS

Bathelt, R. et al., "Light extraction from OLEDs for lighting applications through light scattering", Organic Electronics, Dec. 22, 2006, pp. 293-299, vol. 8.

(Continued)

*Primary Examiner* — Thao P Le
(74) *Attorney, Agent, or Firm* — Christie, Parker & Hale LLP

(57) ABSTRACT

An organic light emitting display (OLED) device includes: an insulating substrate; a first electrode on the insulating substrate; a second electrode on the first electrode; a light-emitting layer between the first electrode and the second electrode; a hole common layer between the first electrode and the light-emitting layer; an electron common layer between the second electrode and the light-emitting layer; and a scattering layer on the insulating substrate and having a non-planar surface, wherein the scattering layer includes at least one of benzene, naphthalene, anthracene, tetracene, pentacene, amine, benzidine, biphenyl, carbazole, pyridine, bipyridine, imidazole, phenanthroline, phenylborane, pyrimidine, or triazine, and the base material of the scattering layer includes a substituent including at least one of a benzoyl group, a carboxyl group, an aminophenoxyl group, a tricabonate group, or a styryl group.

18 Claims, 6 Drawing Sheets

(56) References Cited

U.S. PATENT DOCUMENTS

2010/0102706 A1    4/2010  Miller et al.
2014/0191208 A1*   7/2014  Kim et al. .................. 257/40

FOREIGN PATENT DOCUMENTS

| KR | 10-2007-0052388 | 5/2007 |
| KR | 10-2013-0026910 | 3/2013 |

OTHER PUBLICATIONS

Gifford, D.K. et al., "Emission through one of two metal electrodes of an organic light-emitting diode via surface-plasmon cross coupling", Applied Physics Letters, Dec. 2, 2002, pp. 4315-4317, vol. 81, No. 23.

Ishihara, K. et al., "Organic light-emitting diodes with photonic crystals on glass substrate fabricated by nanoimprint lithography", Applied Physics Letters, Mar. 15, 2007, pp. 111114-1-111114-3, vol. 90.

* cited by examiner

ORGANIC LIGHT EMITTING DISPLAY DEVICE AND FABRICATING METHOD THEREOF

CROSS-REFERENCE TO RELATED APPLICATION

This patent application claims priority to and the benefit of Korean Patent Application No. 10-2013-0156528, filed on Dec. 16, 2013, in the Korean Intellectual Property Office, the entire content of which is hereby incorporated by reference.

BACKGROUND

1. Field

Aspects of example embodiments of the inventive concept relate to an organic light emitting display device and a fabricating method thereof.

2. Description of the Related Art

Due to its self-luminous property, an organic light emitting display (OLED) apparatus generally does not utilize an additional light source and has the characteristic of enabling electronic products to be relatively small and light compared to electronic devices utilizing other display devices. Further, OLED devices may have relatively lower power consumption, higher brightness, and higher reaction rate compared to other display devices, and thus, OLED devices have received attention as next-generation display devices.

OLED devices include an anode, an organic light emitting layer, and a cathode. Holes and electrons injected from the anode and the cathode, respectively, are combined with each other in the organic light emitting layer of the OLED device to produce excitons. Light is emitted from the organic light emitting layer, when the excitons are transited from an excited state to a ground state.

Further, the light emitted from the organic light emitting layer may be reflected by an interface between adjacent layers, thereby causing a resonance phenomenon. However, as the result of the resonance, the OLED device may suffer from a viewing-angle-dependent color shift.

SUMMARY

Aspects of example embodiments of the inventive concept include an organic light emitting display (OLED) device having relatively high light extraction efficiency and a fabricating method thereof.

Aspects of example embodiments of the inventive concept include an OLED device, in which resonance and color shift can be suppressed or reduced.

Aspects of example embodiments of the inventive concept include a method of forming a scattering layer of an OLED device.

According to aspects of example embodiments of the inventive concept, an OLED device includes an insulating substrate; a first electrode on the insulating substrate; a second electrode on the first electrode; a light-emitting layer between the first electrode and the second electrode; a hole common layer between the first electrode and the light-emitting layer; an electron common layer between the second electrode and the light-emitting layer; and a scattering layer on the insulating substrate and having a non-planar surface, wherein the scattering layer includes at least one of benzene, naphthalene, anthracene, tetracene, pentacene, amine, benzidine, biphenyl, carbazole, pyridine, bipyridine, imidazole, phenanthroline, phenylborane, pyrimidine, or triazine, and a base material of the scattering layer includes a substituent including at least one of a benzoyl group, a carboxyl group, an aminophenoxyl group, a tricabonate group, or a styryl group.

The scattering layer may be between two adjacent ones among the first electrode, the hole common layer, the light-emitting layer, the electron common layer, and the second electrode, or may be on the second electrode.

The non-planar surface may include a plurality of concavo-convex portions.

The base material may include a substitution position occupied by the substituent.

The hole common layer may include: a hole injection layer on the first electrode; and a hole transport layer on the hole injection layer, and the scattering layer may be between the hole injection layer and the hole transport layer.

The electron common layer may include at least two of: a hole blocking layer on the light-emitting layer; an electron transport layer on the hole blocking layer; and an electron injection layer on the electron transport layer, and the scattering layer may be between adjacent two of the hole blocking layer, the electron transport layer, or the electron injection layer.

The scattering layer may insulates the first electrode, the hole common layer, the light-emitting layer, the electron common layer, and the second electrode from external contaminants.

The OLED device may further include an encapsulation layer on the second electrode which may insulate the first electrode, the hole common layer, the light-emitting layer, the electron common layer, and the second electrode from external contaminants.

At least one of the first electrode, the hole common layer, the light-emitting layer, the electron common layer, the second electrode, or the encapsulation layer may be on the scattering layer, and may have an uneven surface with concavo-convex portions.

The OLED device may further include a charge generation layer configured to supply electric charges into the light-emitting layer, and the light-emitting layer may include a first light-emitting layer and a second light-emitting layer spaced apart from each other by the charge generation layer, and the scattering layer may be between the first light-emitting layer and the charge generation layer or between the second light-emitting layer and the charge generation layer.

The hole common layer may include: a first hole common layer between the first electrode and the first light-emitting layer; and a second hole common layer between the charge generation layer and the second light-emitting layer, and the electron common layer may include: a first electron common layer between the charge generation layer and the first light-emitting layer; and a second electron common layer between the second electrode and the second light-emitting layer.

Each of the first hole common layer and the second hole common layer may include: a hole injection layer; and a hole transport layer on the hole injection layer, and the scattering layer is between the hole injection layer and the hole transport layer.

Each of the first electron common layer and the second electron common layer may include at least two of: a hole blocking layer; an electron transport layer on the hole blocking layer; and an electron injection layer on the electron transport layer, and the scattering layer may be between adjacent two of the hole blocking layer, the electron transport layer, and the electron injection layer.

According to aspects of embodiments of the present invention, a method of fabricating an OLED device includes: forming a first electrode on an insulating substrate; forming a hole common layer on the first electrode; forming a light-emitting layer on the hole common layer; forming an electron common layer on the light-emitting layer; forming a second electrode on the electron common layer; and forming a scattering layer with an uneven surface, on the insulating substrate, wherein the scattering layer comprises at least one of benzene, naphthalene, anthracene, tetracene, pentacene, amine, benzidine, biphenyl, carbazole, pyridine, bipyridine, imidazole, phenanthroline, phenylborane, pyrimidine, or triazine, and a base material of the scattering layer comprises a substituent comprising at least one of a benzoyl group, a carboxyl group, an aminophenoxyl group, a tricabonate group, or a styryl group.

The method may further include forming the scattering layer between adjacent two of the insulating substrate, the first electrode, the hole common layer, the light-emitting layer, the electron common layer, and the second electrode, or on the second electrode.

The forming of the scattering layer may be performed using a thermal deposition process or an electron-beam deposition process.

The base material may include a substitution position occupied by the substituent.

The insulating substrate, the first electrode, the hole common layer, the light-emitting layer, the electron common layer, the second electrode, and the scattering layer may be formed using a same deposition technology.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
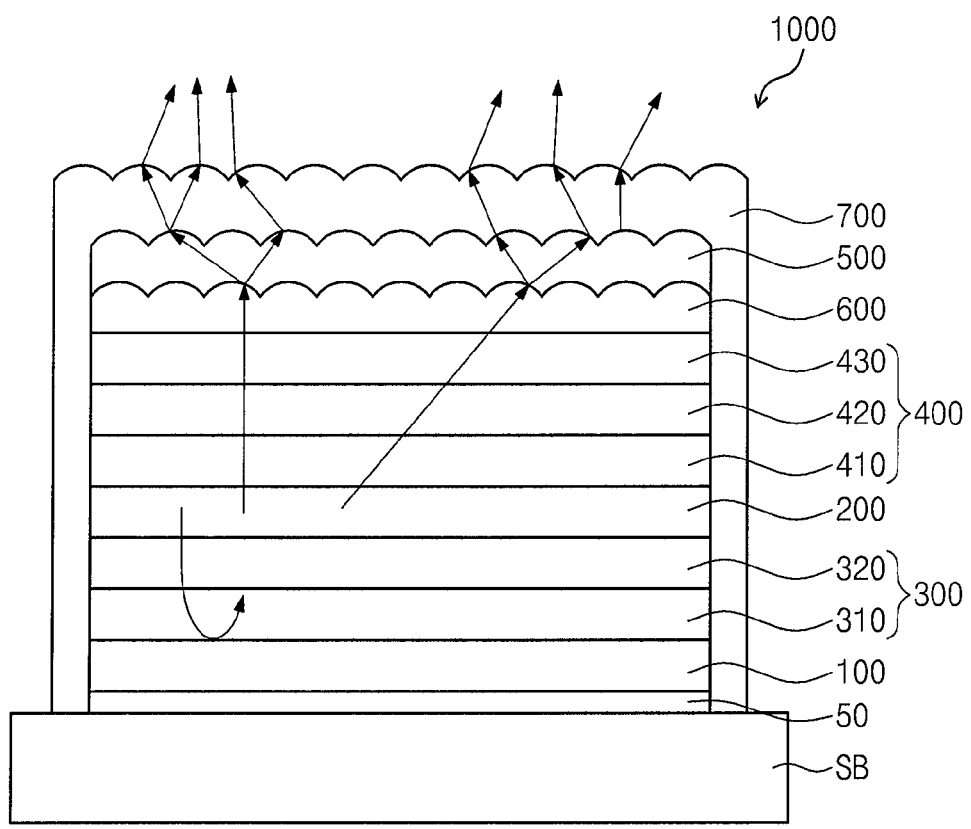
FIG. 1 is a sectional view schematically illustrating an OLED device, according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be more thorough and more complete, and will more fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or directly coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes," and/or "including," if used herein, specify the presence of stated features, integers, steps, operations, elements, and/or components, but do not preclude the presence or addition of one or more other features, integers, steps, operations, elements, components, and/or groups thereof.

The phrase "at least two of" a group of elements (e.g., elements A, B, and C) does not refer to the individual elements of the group, but instead refers to the group collectively. Therefore, for example, for a component comprising at least two of: element "A"; element "B"; and element "C," the component comprises at least A and B, at least A and C, or at least B and C, and does not necessarily comprise two of each of the elements A, B, and C.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
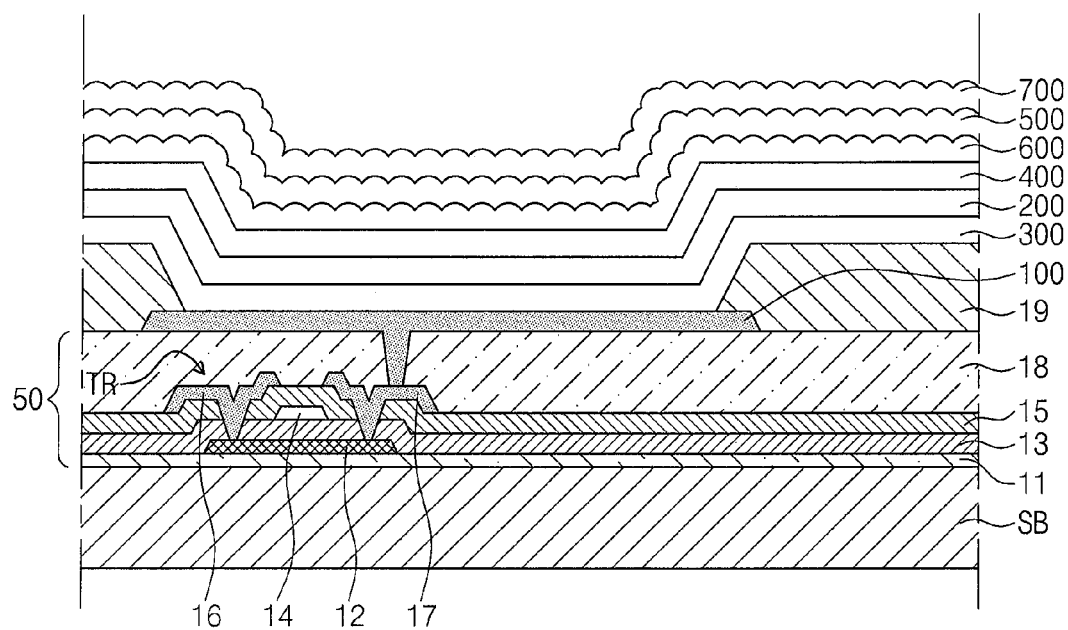
FIG. 2 is a sectional view illustrating one of pixels constituting the OLED device of FIG. 1.
Figure 3:
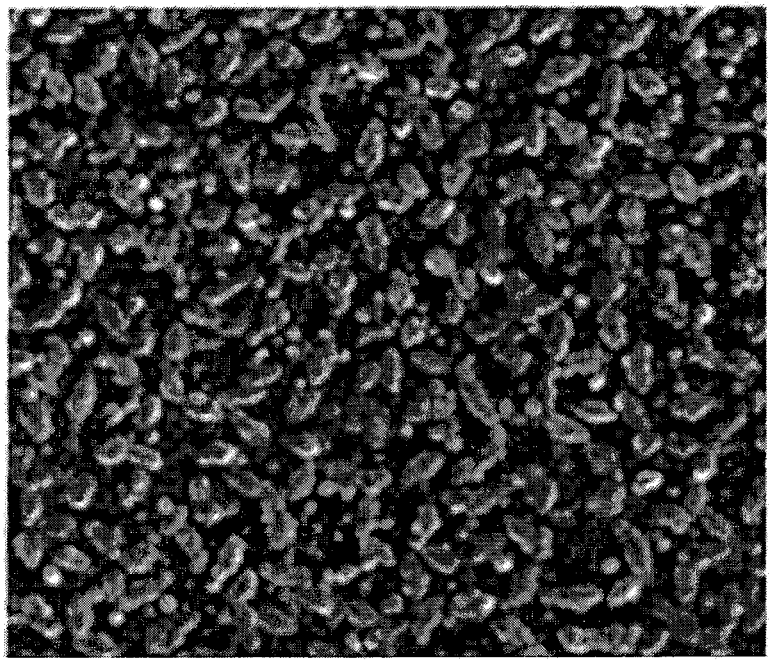
FIG. 3 is an image showing an uneven surface of the OLED device.

FIG. 1 is a sectional view schematically illustrating an OLED device 1000, according to example embodiments of the inventive concept. FIG. 2 is a sectional view illustrating one of a plurality of pixels constituting the OLED device 1000 of FIG. 1, and FIG. 3 is an image showing an uneven (e.g., non-planar) surface of the OLED device 1000.

Referring to FIGS. 1 and 2, the OLED device 1000 may include a driving device layer 50, a first electrode 100, a hole common layer 300, a light-emitting layer 200, an electron common layer 400, a second electrode 500, an encapsulation layer 700, and a scattering layer 600 provided on a substrate SB.

A thin-film transistor TR may be formed in the driving device layer 50. The driving device layer 50 may include a plurality of layers interposed between the first electrode 100 and the substrate SB.

For example, a buffer layer 11 may be formed on the substrate SB, and the thin-film transistor TR may be formed on the buffer layer 11.

Although one thin-film transistor TR is illustrate in FIG. 2, the number of the thin-film transistors TR may not be limited to the example of FIG. 2. For example, a plurality of thin-film transistors may be provided in each pixel.

A semiconductor active layer 12 may be formed on the buffer layer 11.

The buffer layer 11 may be configured to prevent or reduce impurities from being injected into or otherwise contaminating the thin-film transistors TR through the substrate SB and provide a flat surface. The buffer layer 11 may be formed of at least one of various materials capable of realizing such functions. For example, the buffer layer 11 may contain at least one of inorganic materials (e.g., silicon oxide, silicon nitride, silicon oxynitride, aluminum oxide, aluminum nitride, titanium oxide or titanium nitride) or organic materials (e.g., polyimide, polyester, or acrylic). In some embodiments, the buffer layer 11 may be provided to include more than one of the enumerated materials and thereby have a stack-like structure. Nevertheless, in some embodiments, the buffer layer 11 may be omitted.

The semiconductor active layer 12 may be formed of poly silicon, but example embodiments of the inventive concept may not be limited thereto. For example, the semiconductor active layer 12 may be formed of oxide semiconductor (e.g., G—I—Z—O layer [(In2O3)a(Ga2O3)b(ZnO)c layer, where a, b, and c are real numbers satisfying conditions of a≥0, b≥0, and c>0, respectively].

A gate insulating layer 13 may be formed to cover the semiconductor active layer 12, and a gate electrode 14 may be formed on the gate insulating layer 13.

An interlayered insulating layer 15 may be formed to cover the gate electrode 14, and a source electrode 16 and a drain electrode 17 may be formed on the interlayered insulating layer 15 and be electrically coupled to portions of the semiconductor active layer 12.

Example embodiments of the inventive concept may not be limited to the above-described structure of the thin-film transistor TR. For example, the thin-film transistor TR may be formed to have not only a top-gate structure, as shown in FIG. 2, but also a bottom-gate structure, in which the gate electrode 14 is positioned below the semiconductor active layer 12. Further, all known types of the thin-film transistor may be used to realize the OLED device according to example embodiments of the inventive concept.

A passivation layer 18 may be formed on the source electrode 16 and the drain electrode 17. The passivation layer 18 may be formed to have a flat top surface and include one or more insulating layer(s). The passivation layer 18 may be formed of at least one of inorganic and/or organic materials.

The first electrode 100 may be formed on the passivation layer 18 and electrically coupled to the thin-film transistor TR. The first electrode 100 may be provided in the form of island, and each first electrode 100 may be provided in a corresponding one of the pixels.

A pixel-defining layer 19 may be formed on the passivation layer 218 to cover an edge portion of the first electrode 100. An opening 19a may be formed in the pixel-defining layer 19 to expose a central portion of the first electrode 100, while maintaining coverage over the edge portion of the first electrode 100 by the pixel-defining layer 19. In certain embodiments, the first electrode 100 may serve as an anode. Here, the first electrode 100 may be a transparent electrode (e.g., of ITO or IZO). Alternatively, the first electrode 100 may be formed of one selected from the group consisting of Pt, Cr, Ag, Ni, Al, and any alloys thereof, and in this case, it may serve as a reflection electrode. Signals applied to the source electrode 16 may be transferred to the drain electrode 17, in response to gate signal applied to the gate electrode 14, and then, be transferred to the first electrode 100.

The second electrode 500 may serve as a cathode. The second electrode 500 may be a thin transparent electrode, which is made of one selected from the group consisting of Mg, Ca, Al, Ag, Ba, and any alloys thereof, or be a thick reflective electrode.

In some embodiments, the first and second electrodes 100 and 500 may be configured to serve as the cathode and the anode, respectively.

The hole common layer 300 may be provided between the first electrode 100 and the light-emitting layer 200. The hole common layer 300 may include a hole injection layer 310 and a hole transport layer 320.

The hole injection layer 310 may be provided on the first electrode 100. The first hole injection layer 310 may be configured in such a way that holes can be effectively injected from the first electrode 100 to the light-emitting layer 200. For this, the hole injection layer 310 may include, for example, copper phthalocyanine (CuPc), poly(3,4)-ethylenedioxythiophene (PEDOT), polyaniline (PANI), or N,N-dinaphthyl-N,N'-diphenylbenzidine (NPD), but example embodiments of the inventive concept may not be limited thereto.

The hole transport layer 320 may be provided on the hole injection layer 310. The hole transport layer 320 may be configured in such a way that the holes can be effectively transported from the hole injection layer 310. Here, the hole transport layer 320 may be configured to have a highest occupied molecular energy (HOMO) that is substantially lower than a work function of the first electrode 100 and is substantially higher than a HOMO of the light-emitting layer 200, and in this case, the hole transport layer 320 may have an increased efficiency of hole transportation. For this, the hole transport layer 320 may include, for example, N,N-dinaphthyl-N,N'-diphenylbenzidine (NPD), N,N'-bis-(3-methylphenyl)-N,N'-bis-(phenyl)-benzidine (TPD), s-TAD, 4,4',4"-Tris(N-3-methylphenyl-N-phenyl-amino)-triphenylamine (MTDATA), but example embodiments of the inventive concept may not be limited thereto.

The light-emitting layer 200 may be provided between the first electrode 100 and the second electrode 500. The light-emitting layer 200 may be provided on the hole transport layer 320.

The light-emitting layer 200 may be formed of an organic material or a mixture of organic and inorganic materials, which can emit one of primary colors (e.g., three primary colors (red, green, and blue)). For example, the light-emitting layer 200 may be formed of a fluorescence or phosphorescence organic material. In example embodiments, the light-emitting layer 200 may be formed of at least one selected from the group consisting of tris(4-methyl-8-quinolinolate) aluminum(III) (Alg3), 4-MAlq3, Gaq3 materials, Alq series, C-545T ($C_{26}H_{26}N_2O_2S$), DSA-amine, TBSA, BTP, PAPNPA, spiro-FPA, Ph3Si (PhTDAOXD), PPCP (1,2,3,4,5-pentaphenyl-1,3-cyclopentadiene) as cyclopenadiene derivatives, DPVBi (4,4'-bis(2,2'-diphenylyinyl)-1,1'-biphenyl), distyrylbenzene or its derivatives, DCJTB (4-(Dicyanomethylene)-2-tert-butyl-6-(1,1,7,7,-tetramethyljulolidyl-9-enyl)-4H-pyran), DDP, AARP, NPAMLI, Firpic, m-Firpic, N-Firpic, bon2Ir (acac), (C6)2Ir(acac), bt2Ir (acac), dp2Ir (acac), bzq2Ir(acac), bo2Ir(acac), F2Ir(bpy), F2Ir(acac), op2Ir(acac), ppy2Ir(acac), tpy2Ir(acac), FIrppy (fac-tris[2-(4,5'-difluorophenyl) pyridine-C'2,N]iridium(III)), Btp2Ir (acac) (bis(2-(2'-benzo[4,5-a]thienyl) pyridinato-N,C3'-) iridium(acetylactonate)), or phosphorescence materials, but example embodiments of the inventive concept may not be limited thereto. The light-emitting layer 200 may be configured to have a Host-Dopant system, in which at least one of the enumerated materials is used as host and at least one of perylene, distyrylbiphenyl, DPT, quinacridone, rubrene, BTX, ABTX, or DCJTB is used as dopants.

The electron common layer 400 may be provided between the second electrode 500 and the light-emitting layer 200. The electron common layer 400 may include at least two of a hole blocking layer 410, an electron transport layer 420, and an electron injection layer 430. In example embodiments, the electron common layer 400 may be configured to include the hole blocking layer 410, the electron transport layer 420, and the electron injection layer 430, and the following description will be given on such embodiments.

The hole blocking layer 410 may be provided on the light-emitting layer 200. An electron mobility may be higher than hole mobility in the light-emitting layer 200, and in this case, the hole blocking layer 410 may be configured in such a way that holes can be prevented or substantially prevented from being moved away from the emitting region. The hole blocking layer 410 may be formed of at least one selected from the group consisting of 2-biphenyl-4-yl-5-(4-t-butylphenyl)-1,3,4-oxydiazole (PBD), spiro-PBD, and 3-(4'-tert-butylphenyl)-4-phenyl-5-(4'-biphenyl)-1,2,4-triazole (TAZ).

The electron transport layer 420 may be provided on the hole blocking layer 410. The electron transport layer 420 may be configured in such a way that electrons can be effectively transported from the electron injection layer 430. For example, the electron transport layer 420 may include at least one selected from the group consisting of Alq3 (tris(8-hydroxyquinolino)aluminum), PBD, TAZ, spiro-PBD, BAlq, and SAlq, but example embodiments of the inventive concept may not be limited thereto.

The electron injection layer 430 may be provided on the electron transport layer 420. The electron injection layer 430 may be configured in such a way that electrons can be effectively injected from the second electrode 500 to the light-emitting layer 200. For example, the electron injection layer 430 may include at least one selected from the group consisting of 1,3,4-Oxadiazole derivatives, 1,2,4-triazole derivatives, and LiF, but example embodiments of the inventive concept may not be limited thereto.

The encapsulation layer 700 may be provided on the second electrode 500. The encapsulation layer 700 may encapsulate the first electrode 100, the hole common layer 300, the light-emitting layer 200, the electron common layer 400, and the second electrode 500, which are positioned between the substrate SB and the encapsulation layer 700. For example, the encapsulation layer 700 may be configured to block oxygen and moisture from the outside.

The scattering layer 600 may be provided between adjacent two of the first electrode 100, the hole injection layer 310, the hole transport layer 320, the light-emitting layer 200, the hole blocking layer 410, the electron transport layer 420, the electron injection layer 430, the second electrode 500, and the encapsulation layer 700. Further, the scattering layer 600 may be provided on the encapsulation layer 700.

As shown in FIG. 1, the scattering layer 600 may be provided between the electron injection layer 430 and the second electrode 500, but example embodiments of the inventive concept may not be limited thereto, as described above.

The scattering layer 600 may be formed to have an uneven (e.g., non-planar) surface. Referring to FIG. 3, the scattering layer 600 may be formed to have concavo-convex portions, which may be randomly distributed. As illustrated by the arrows of FIG. 1, light emitted from the light-emitting layer 200 may be scattered by the concavo-convex portions or the uneven surface, when it passes through the scattering layer 600.

Due to the presence of the uneven surface of the scattering layer 600, additional layers provided or formed on the scattering layer 600 may also be formed to have an uneven surface or concavo-convex portions. Accordingly, in the case where at least one of the first electrode 100, the hole common layer 300, the light-emitting layer 200, the electron common layer 400, the second electrode 500, or the encapsulation layer 700 is provided on the scattering layer 600, it may have an uneven surface. In the example of FIG. 1, the second electrode 500 may be provided on the scattering layer 600, and thus, the second electrode 500 may be formed to have an uneven top surface. If the scattering layer 600 is provided between the first electrode 100 and the hole injection layer 310, each of the hole injection layer 310, the hole transport layer 320, the light-emitting layer 200, the hole blocking layer 410, the electron transport layer 420, the electron injection layer 430, and the second electrode 500 may have an uneven top surface.

The scattering layer 600 may include at least one selected from the base materials including benzene, naphthalene, anthracene, tetracene, pentacene, amine, benzidine, biphenyl, carbazole, pyridine, bipyridine, imidazole, phenanthroline, phenylborane, pyrimidine, or triazine.

The base materials may be substituted by at least one substituent, which may be selected from a benzoyl group, a carboxyl group, an aminophenoxyl group, a tricabonate group, and a styryl group.

The base material may have a plurality of substitution positions, which can be substituted by the substituent. Accordingly, for one molecule in the base material, a plurality of substituents may be substituted at a plurality of substitution positions.

Molecules constituting the base material may have a plane or plane-like structure, and in this case, the base material may have a laminated structure. Further, because the substituent may have a flexible molecular structure, it may be prone to aggregation.

According to example embodiments of the inventive concept, the OLED device 1000 may include the scattering layer 600 configured to scatter an incident light, thereby having increased efficiency of light extraction.

For example, if the OLED device does not have the scattering layer 600, light emitted from the light-emitting layer may be reflected by an interface between adjacent layers, thereby causing a resonance phenomenon and a viewing-angle-dependent color shift. By contrast, according to example embodiments of the inventive concept, because the scattering layer 600 in the OLED device 1000 may scatter the incident light, it may be possible to suppress or reduce the resonance phenomena and the color shift from occurring.

Figure 4:
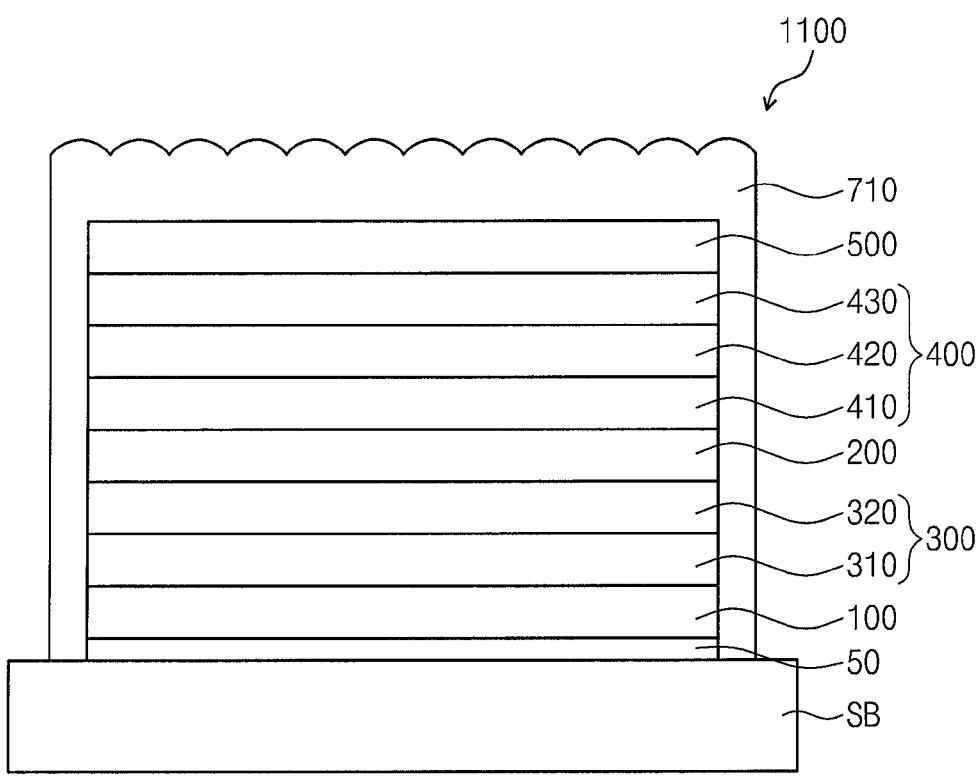
FIG. 4 is a sectional view illustrating an OLED device, according to other example embodiments of the inventive concept.

FIG. 4 is a sectional view illustrating an OLED device, according to other example embodiments of the inventive concept.

Referring to FIG. 4, an OLED device 1100 may include an encapsulation layer 710 serving as the scattering layer. Except for this difference, the OLED device 1100 may be configured to have substantially the same features as those of FIG. 1. Thus, in the following description of FIG. 4, a previously described element may be identified by a similar or identical reference number without repeating an overlapping description thereof, for the sake of brevity.

The encapsulation layer 710 may be provided on the second electrode. The encapsulation layer 710 may encapsulate the first electrode 100, the hole common layer 300, the light-emitting layer 200, the electron common layer 400, and the second electrode 500, which are positioned between the substrate SB and the encapsulation layer 710. For example, the encapsulation layer 700 may be configured to block or reduce oxygen and moisture from the outside from contaminating the other layers.

The encapsulation layer 710 may be configured to provide the same effect as that of the scattering layer 600 of FIG. 1. For example, the encapsulation layer 710 may be formed to have an uneven surface. In example embodiments, the encapsulation layer 710 may be formed to have concavo-convex portions, which may be randomly distributed. Light emitted from the light-emitting layer 200 may be scattered by the concavo-convex portions or the uneven surface of the encapsulation layer 710, when it passes through the encapsulation layer 710.

The encapsulation layer 710 may include at least one selected from base materials including benzene, naphthalene, anthracene, tetracene, pentacene, amine, benzidine, biphenyl, carbazole, pyridine, bipyridine, imidazole, phenanthroline, phenylborane, pyrimidine, or triazine.

The base materials may be substituted by at least one substituent, which may be selected from a benzoyl group, a carboxyl group, an aminophenoxyl group, a tricabonate group, and a styryl group.

Figure 5:
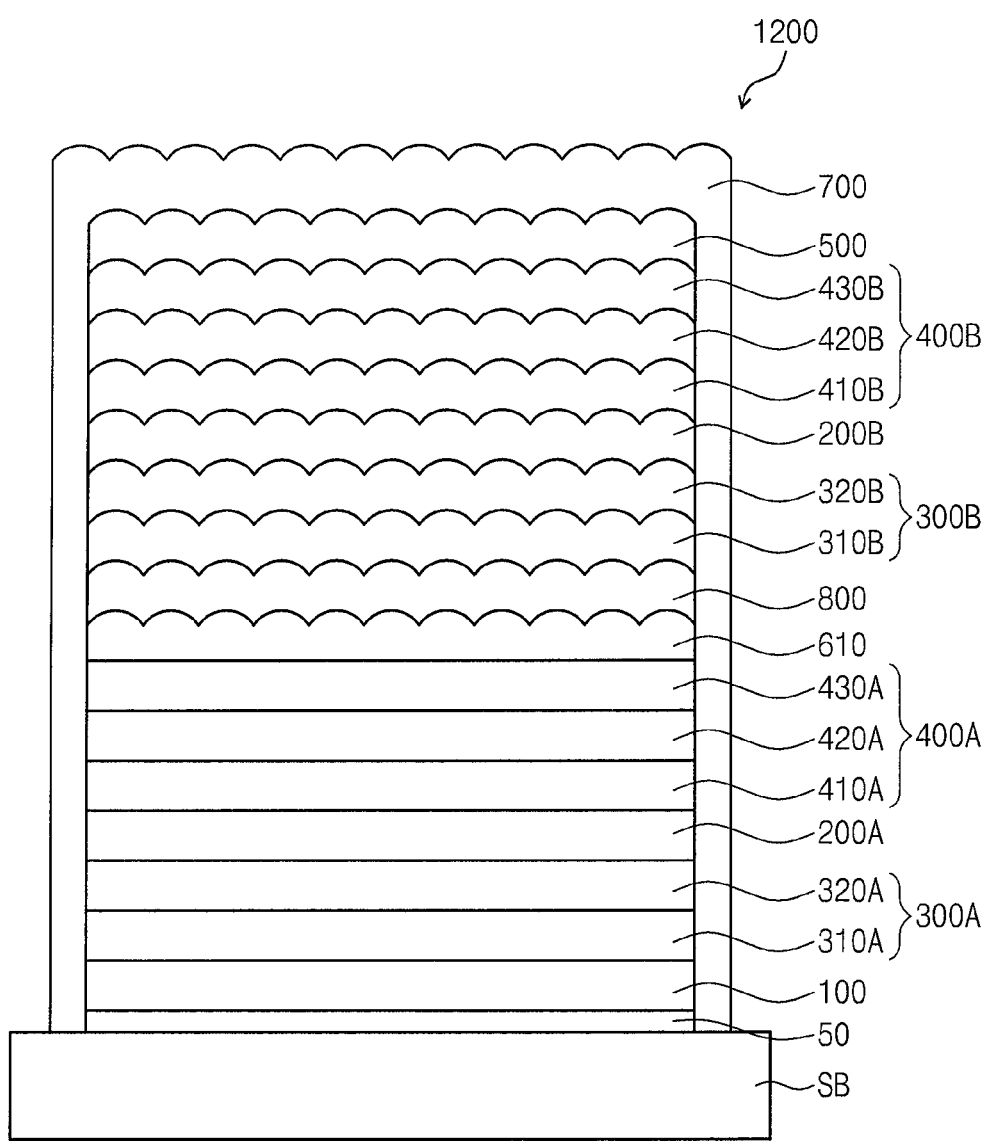
FIG. 5 is a sectional view illustrating an OLED device, according to still other example embodiments of the inventive concept.

FIG. 5 is a sectional view illustrating an OLED device, according some example embodiments of the inventive concept.

For the sake of brevity, in the following description of FIG. 5, previously described elements may be identified by similar or identical reference numbers without repeating all of the description thereof.

Referring to FIG. 5, an OLED device 1200 may include the driving device layer 50, the first electrode 100, a first hole common layer 300A, a first light-emitting layer 200A, a first electron common layer 400A, a charge generation layer 800, a second hole common layer 300B, a second light-emitting layer 200B, a second electron common layer 400B, the second electrode 500, the encapsulation layer 700, and a scattering layer 610 provided on the substrate SB.

The driving device layer 50, the first electrode 100 and the second electrode 500 may be configured to have substantially the same features as those of FIG. 1, and thus, some repetitive description thereto will be omitted below.

The first hole common layer 300A may be provided between the first electrode 100 and the first light-emitting layer 200A. The first hole common layer 300A may include a first hole injection layer 310A and a first hole transport layer 320A.

The first hole injection layer 310A may be provided on the first electrode 100. The first hole transport layer 320A may be provided on the first hole injection layer 310A. The first hole injection layer 310A and the first hole transport layer 320A may be configured to provide the same effect as and contain the same material as the hole injection layer 310 and the hole transport layer 320, respectively, of FIG. 1.

The first light-emitting layer 200A may be provided between the first electrode 100 and the charge generation layer 800. The first light-emitting layer 200A may be configured to provide the same effect as and contain the same material as the light-emitting layer 200 of FIG. 1.

The first electron common layer 400A may be provided between the charge generation layer 800 and the first light-emitting layer 200A. The first electron common layer 400A may include at least two of a first hole blocking layer 410A, a first electron transport layer 420A, and a first electron injection layer 430A. In example embodiments, the first electron common layer 400A may be configured to include each of the first hole blocking layer 410A, the first electron common layer 420A, and the first electron injection layer 430A, and the following description will be given on such embodiments.

The first hole blocking layer 410A may be provided on the first light-emitting layer 200A. The first electron transport layer 420A may be provided on the first hole blocking layer 410A. The first electron injection layer 430A may be provided on the first electron transport layer 420A. The first hole blocking layer 410A, the first electron transport layer 420A, and the first electron injection layer 430A may be configured to provide the same effect as and contain the same material as the hole blocking layer 410, the electron transport layer 420, and the electron injection layer 430, respectively, of FIG. 1.

The charge generation layer 800 may be provided between the first light-emitting layer 200A and the second light-emitting layer 200B. For example, the charge generation layer 800 may be provided between the first electron common layer 400A and the second hole common layer 300B. The charge generation layer 800 may serve as a cathode substantially with respect to the first light-emitting layer 200A and serve as an anode substantially with respect to the second light-emitting layer 200B.

The charge generation layer 800 may have a single- or double-layered structure. In example embodiments, the charge generation layer 800 may be formed to have a single-layered structure made of metal oxide (for example, including vanadium oxide (VOx) or tungsten oxide (WOx)). In other example embodiments, the charge generation layer 800 may be formed to have a double-layered structure including a metal oxide layer and a metal layer. In this case, the metal oxide layer may include vanadium oxide or tungsten oxide, and the metal layer may include aluminum or silver.

In the case where voltages are applied to the first electrode 100 and the second electrode 500, electric charges (e.g., electrons or holes) may be generated in the charge generation layer 800 and be provided into the first light-emitting layer 200A and the second light-emitting layer 200B positioned adjacent to the charge generation layer 800.

The second hole common layer 300B may be provided between the charge generation layer 800 and the second light-emitting layer 200B. The second hole common layer 300B may include a second hole injection layer 310B and a second hole transport layer 320B.

The second hole injection layer 310B may be provided on the charge generation layer 800. The second hole transport layer 320B may be provided on the second hole injection layer 310B. The second hole injection layer 310B and the second hole transport layer 320B may be configured to provide the same effect as and contain the same material as the hole injection layer 310 and the hole transport layer 320, respectively, of FIG. 1.

The second light-emitting layer 200B may be provided between the second electrode 500 and the charge generation layer 800. The second light-emitting layer 200B may be configured to provide the same effect as and contain the same material as the light-emitting layer 200 of FIG. 1.

The second electron common layer 400B may be provided between the second electrode 500 and the second light-emitting layer 200B. The second electron common layer 400B may include at least two of a second hole blocking layer 410B, a second electron transport layer 420B, and a second electron injection layer 430B. In example embodiments, the second electron common layer 400B may be configured to include each of the second hole blocking layer 410B, the second electron common layer 420B, and the second electron injection layer 430B, and the following description will be given on such embodiments.

The second hole blocking layer 410B may be provided on the second light-emitting layer 200B. The second electron transport layer 420B may be provided on the second hole blocking layer 410B. The second electron injection layer 430B may be provided on the second electron transport layer 420B. The second hole blocking layer 410B, the second electron transport layer 420B, and the second electron injection layer 430B may be configured to provide the same effect as and contain the same material as the hole blocking layer 410, the electron transport layer 420, and the electron injection layer 430, respectively, of FIG. 1.

The encapsulation layer 700 may be provided on the second electrode 500. The encapsulation layer 700 may encapsulate the first electrode 100, the first hole common layer 300A, the first light-emitting layer 200A, the first electron common layer 400A, the charge generation layer 800, the second hole common layer 300B, the second light-emitting layer 200B, the second electron common layer 400B, and the second electrode 500, which are positioned between the substrate SB and the encapsulation layer 700. The encapsulation layer 700 may be configured to block oxygen and moisture from the outside.

The scattering layer 610 may be provided between adjacent two of the first electrode 100, the first hole common layer 300A, the first light-emitting layer 200A, the first electron common layer 400A, the charge generation layer 800, the second hole common layer 300B, the second light-emitting layer 200B, the second electron common layer 400B, and the second electrode 500, and the encapsulation layer 700. Further, the scattering layer 610 may be provided on the encapsulation layer 700.

As shown in FIG. 5, the scattering layer 610 may be provided between the charge generation layer 800 and the first electron common layer 400A, but example embodiments of the inventive concept may not be limited thereto, as described above.

The scattering layer 610 may be configured to have substantially the same features as the scattering layer 600 of FIG. 1, in terms of shape, effect, function, and material.

Figure 6:
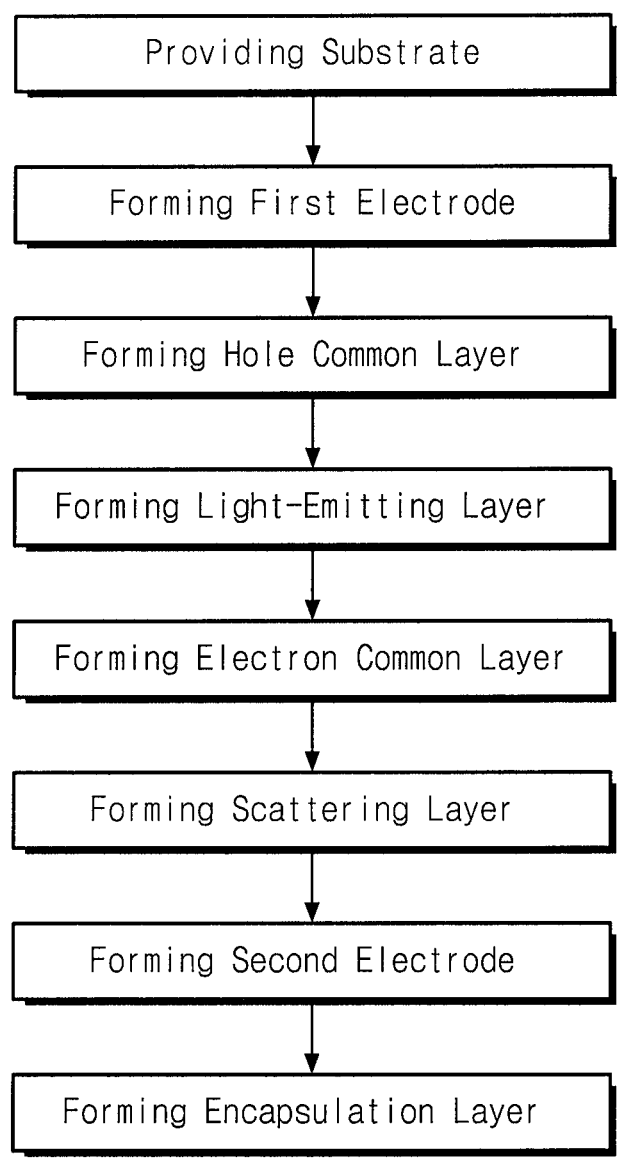
FIG. 6 is a flowchart illustrating a method of fabricating the OLED device of FIG. 1.

FIG. 6 is a flowchart illustrating a method of fabricating the OLED device 1000 of FIG. 1.

Referring to FIGS. 1 and 6, a method of fabricating the OLED device 1000 may include a first step of providing an insulating substrate; a second step of forming a first electrode; a third step of forming a hole common layer on the first electrode; a fourth step of forming a light-emitting layer on the hole common layer; a fifth step of forming an electron common layer on the light-emitting layer; a sixth step of forming a second electrode on the electron common layer; and a step of forming a scattering layer having an uneven surface on the insulating substrate.

The insulating substrate SB may be a transparent insulating substrate.

The third step may include forming a hole injection layer and forming a hole transport layer.

The fifth step may include forming an electron injection layer and an electron transport layer.

At least one of the first to sixth steps may be performed using a deposition process.

The step of forming the scattering layer may be performed between adjacent two of the first to sixth steps. For example, the step of forming the scattering layer may be performed after the sixth step, but example embodiments of the inventive concept may not be limited thereto. In other example embodiments, the step of forming the scattering layer may be performed between steps of forming the hole injection layer and the hole transport layer. In still other example embodiments, the step of forming the scattering layer may be performed between steps of forming the electron injection layer and the electron transport layer.

In the description of FIGS. 1 and 6, an embodiment, in which the scattering layer 600 is formed between the electron common layer 400 and the second electrode 500, will be described as example embodiments of the inventive concept.

The step of forming the scattering layer may be performed using a thermal deposition process or an electron-beam deposition process. In the case where the scattering layer 600 is formed using the thermal deposition process, a deposition-target compound may be provided in a deposition source container, and then, the deposition source container may be heated. In this case, the deposition-target compound may be evaporated and be deposited on the electron common layer 400.

The deposition-target compound may include at least one selected from base materials including benzene, naphthalene, anthracene, tetracene, pentacene, amine, benzidine, biphenyl, carbazole, pyridine, bipyridine, imidazole, phenanthroline, phenylborane, pyrimidine, or triazine. The base materials may be substituted by at least one substituent, which may be selected from benzoyl group, carboxyl group, aminophenoxyl group, tricabonate group, and styryl group.

The base material may have a plurality of substitution positions, which can be substituted by the substituent. Accordingly, for one molecule in the base material, a plurality of substituents may be substituted at a plurality of substitution positions.

Molecules constituting the base material may have a plane or plane-like structure, and in this case, the base material may have a laminated structure. Further, because the substituent may have a flexible molecular structure, it may be prone to aggregation.

The thermal deposition process may be performed at a temperature ranging from about 100° C. to about 600° C.

During the thermal deposition process thereof, the deposition-target compound may be aggregated to have an uneven surface. In the case where the thermal deposition process is performed at a relatively low temperature of, for example, 100° C. or lower, it is relatively more difficult to evaporate the deposition-target compound. By contrast, in the case where the thermal deposition process is performed at a relatively high temperature of, for example, 600° C. or higher, the insulating substrate SB, the first electrode 100, the hole common layer 300, the light-emitting layer 200, or the electron common layer 400 may be thermally damaged.

According to example embodiments of the inventive concept, a method of fabricating the OLED device may include forming the scattering layer using a thermal deposition process or an electron-beam deposition process. It is possible to form the scattering layer having the uneven surface or concavo-convex portions without any additional photolithography process. Accordingly, the scattering layer can be formed by a deposition process (e.g., thermal deposition process), which may be performed in the same manner as that for the first electrode 100, the hole common layer 300, the light-emitting layer 200, and the electron common layer 400, and the second electrode 500, and thus, it is possible to reduce time and cost for the fabrication of the OLED device.

According to example embodiments of the inventive concept, the OLED device may include a scattering layer configured to scatter an incident light, thereby having increased efficiency of light extraction.

Further, due to the presence of the scattering layer scattering the incident light, it may be possible to suppress or reduce the resonance phenomena and the color shift from occurring.

According to example embodiments of the inventive concept, during a method of fabricating the OLED device, it may be possible to form the scattering layer having the uneven surface or concavo-convex portions without any additional photolithography process. Accordingly, the scattering layer can be formed by a deposition process (e.g., thermal deposition process), which may be performed in the same manner as that for a first electrode, a hole common layer, a light-emitting layer, an electron common layer, and a second electrode, and thus, it is possible to reduce time and cost for the fabrication of the OLED device.

While example embodiments of the inventive concepts have been shown and described, it will be understood by one of ordinary skill in the art that variations in form and detail may be made therein without departing from the spirit and scope of the attached claims, and their equivalents.

What is claimed is:

1. An organic light emitting display (OLED) device, comprising:
   an insulating substrate;
   a first electrode on the insulating substrate;
   a second electrode on the first electrode;
   a light-emitting layer between the first electrode and the second electrode;
   a hole common layer between the first electrode and the light-emitting layer;
   an electron common layer between the second electrode and the light-emitting layer; and
   a scattering layer on the insulating substrate and having a non-planar surface,
   wherein the scattering layer comprises at least one of benzene, naphthalene, anthracene, tetracene, pentacene, amine, benzidine, biphenyl, carbazole, pyridine, bipyridine, imidazole, phenanthroline, phenylborane, pyrimidine, or triazine, and
   a base material of the scattering layer comprises a substituent comprising at least one of a benzoyl group, a carboxyl group, an aminophenoxyl group, a tricabonate group, or a styryl group.

2. The device of claim 1, wherein the scattering layer is between two adjacent ones among the first electrode, the hole common layer, the light-emitting layer, the electron common layer, and the second electrode, or is on the second electrode.

3. The device of claim 1, wherein the non-planar surface comprises a plurality of concavo-convex portions.

4. The device of claim 1, wherein the base material comprises a substitution position occupied by the substituent.

5. The device of claim 1, wherein the hole common layer comprises:
   a hole injection layer on the first electrode; and
   a hole transport layer on the hole injection layer,
   wherein the scattering layer is between the hole injection layer and the hole transport layer.

6. The device of claim 1, wherein the electron common layer comprises at least two of:
   a hole blocking layer on the light-emitting layer;
   an electron transport layer on the hole blocking layer; and
   an electron injection layer on the electron transport layer,
   wherein the scattering layer is between adjacent two of the hole blocking layer, the electron transport layer, or the electron injection layer.

7. The device of claim 1, wherein the scattering layer insulates the first electrode, the hole common layer, the light-emitting layer, the electron common layer, and the second electrode from external contaminants.

8. The device of claim 1, further comprising an encapsulation layer on the second electrode to insulate the first electrode, the hole common layer, the light-emitting layer, the electron common layer, and the second electrode from external contaminants.

9. The device of claim 8, wherein at least one of the first electrode, the hole common layer, the light-emitting layer, the electron common layer, the second electrode, or the encapsulation layer is on the scattering layer, thereby having an uneven surface with concavo-convex portions.

10. The device of claim 1, further comprising a charge generation layer configured to supply electric charges into the light-emitting layer,
    wherein the light-emitting layer comprises a first light-emitting layer and a second light-emitting layer spaced apart from each other by the charge generation layer, and
    the scattering layer is between the first light-emitting layer and the charge generation layer or between the second light-emitting layer and the charge generation layer.

11. The device of claim 10, wherein the hole common layer comprises:
    a first hole common layer between the first electrode and the first light-emitting layer; and
    a second hole common layer between the charge generation layer and the second light-emitting layer,
    wherein the electron common layer comprises:
      a first electron common layer between the charge generation layer and the first light-emitting layer; and
      a second electron common layer between the second electrode and the second light-emitting layer.

12. The device of claim 11, wherein each of the first hole common layer and the second hole common layer comprises:
    a hole injection layer; and
    a hole transport layer on the hole injection layer,
    wherein the scattering layer is between the hole injection layer and the hole transport layer.

13. The device of claim 11, wherein each of the first electron common layer and the second electron common layer comprises at least two of:
a hole blocking layer;
an electron transport layer on the hole blocking layer; and
an electron injection layer on the electron transport layer,
wherein the scattering layer is between adjacent two of the hole blocking layer, the electron transport layer, and the electron injection layer.

14. A method of fabricating an organic light emitting display (OLED) device, comprising:
forming a first electrode on an insulating substrate;
forming a hole common layer on the first electrode;
forming a light-emitting layer on the hole common layer;
forming an electron common layer on the light-emitting layer;
forming a second electrode on the electron common layer; and
forming a scattering layer with an uneven surface, on the insulating substrate,
wherein the scattering layer comprises at least one of benzene, naphthalene, anthracene, tetracene, pentacene, amine, benzidine, biphenyl, carbazole, pyridine, bipyridine, imidazole, phenanthroline, phenylborane, pyrimidine, or triazine, and
a base material of the scattering layer comprises a substituent comprising at least one of a benzoyl group, a carboxyl group, an aminophenoxyl group, a tricabonate group, or a styryl group.

15. The method of claim 14, further comprising forming the scattering layer between adjacent two of the insulating substrate, the first electrode, the hole common layer, the light-emitting layer, the electron common layer, and the second electrode, or after the forming of the second electrode.

16. The method of claim 14, wherein the forming of the scattering layer is performed using a thermal deposition process or an electron-beam deposition process.

17. The method of claim 14, wherein the base material comprises a substitution position occupied by the substituent.

18. The method of claim 14, wherein the insulating substrate, the first electrode, the hole common layer, the light-emitting layer, the electron common layer, the second electrode, and the scattering layer are formed using a same deposition technology.

* * * * *